United States Patent [19]

Amouroux et al.

[11] 4,399,116
[45] Aug. 16, 1983

[54] ZONE PURIFICATION OF SILICON IN A REACTIVE PLASMA

[75] Inventors: Jacques Amouroux; Daniel Morvan, both of Paris, France

[73] Assignee: Electricite de France (Service National), Paris, France

[21] Appl. No.: 287,789

[22] Filed: Jul. 28, 1981

[30] Foreign Application Priority Data

Aug. 8, 1980 [FR] France .............................. 80 17120

[51] Int. Cl.³ .............................................. C01B 33/02
[52] U.S. Cl. .................................... 423/348; 204/164; 156/DIG. 64
[58] Field of Search ....... 423/348; 156/620, DIG. 64; 204/164

[56] References Cited

U.S. PATENT DOCUMENTS 2,901,325  8/1959  Theuerer .............................. 423/348

FOREIGN PATENT DOCUMENTS 625027   8/1961  Canada ................................. 423/348
2608965  9/1977  Fed. Rep. of Germany .
2438499  5/1980  France ................................. 423/348
792166   3/1958  United Kingdom ................. 423/348

Primary Examiner—O. R. Vertiz
Assistant Examiner—Steven Capella
Attorney, Agent, or Firm—Larson and Taylor

[57] ABSTRACT

Boron is removed from silicon by zone melting purification. A jet of hot plasma obtained by high frequency excitation is directed on a zone of a bar of silicon to be purified. The plasma is formed from a mixture of a plasma-producing gas, such as argon, and an amount of oxygen which is sufficiently low to avoid oxidization of silicon.

7 Claims, 3 Drawing Figures

ZONE PURIFICATION OF SILICON IN A REACTIVE PLASMA

BACKGROUND AND SUMMARY OF THE INVENTION

The invention relates to zone purification of silicon with reactive plasma heating and an object thereof is boron removal. The invention is particularly, though not exclusively, suitable for use in the manufacture of silicon for photovoltaic cells from commercially available silicon.

For silicon to be usable for photovoltaic cells, its content of several elements must be below very low thresholds. In particular, the percentage of elements termed electron killers (V, Cr, Ti, Zr, Na, Cu for example) must typically be less than 5 parts per billion. The percentage of neutral elements (particularly Fe, Ni, Mg, C, Mn) must not exceed about 1 ppm. Finally, the percentage of doping elements formed by impurities, typically boron and aluminium for P-type silicon, must be reduced to an extremely low value for later accurate control of the final content in doping elements.

Processes are known for purifying silicon by zone melting in which a zone of a bar of silicon to be refined is molten by directing onto this zone a jet of hot plasma obtained by high frequency excitation. The plasma jet and the bar are moved, with respect to one another, so as to cause the melted zone to travel along the bar once or more times. In French Pat. No. 2,438,499, there is described a process using a plasma formed from a plasma-producing gas, particularly argon, and a low percentage of hydrogen. Hydrogen has a reactivity which promotes the removal of certain impurities. But the removal of boron remains difficult with this process, as with other prior art zone purification processes, since boron and silicon form very stable compounds such as $Si_xB_y$. Moreover, boron has a theoretical partition coefficient in silicon between the liquid phase and the solid phase close to unity.

It is an object of the invention to improve the prior art processes and apparatuses for purifying silicon; it is a more specific object to provide a process which effectively removes boron.

A process according to the invention comprises the step of forming a plasma from a mixture of a plasma-producing gas, such as argon or helium, and oxygen, the amount of oxygen being low enough for avoiding appreciable oxidation of silicon.

That process is in direct contradiction with generally accepted ideas, according to which the presence of oxygen in the plasma is to be avoided; it was thought that oxygen, even in very small amounts, leads to troublesome oxidization of the silicon. It has been found that silicon oxidization may be avoided if the amount of oxygen contained in the plasma is adjusted to an appropriate value, which may typically be between 100 and 300 times the boron content. For the amounts of boron contained in currently available industrial silicon, the oxygen content of the plasma then remains sufficiently low to avoid oxidization of the silicon. As a general rule, the oxygen content will typically be between 0.005 and 0.1%, depending on the initial amount of boron contained in the silicon. Several successive passes under the plasma jet, possibly containing different percentages of oxygen, may be required to arrive at a sufficiently low boron content.

The favorable results obtained by the invention may probably be attributed to the transformation of the boron into borosilicate; there is segregation due to movement toward the surface of the bar and the tail end thereof. Borate, is transformed by decomposition of $Si_xB_y$ into volatile compounds of $B_2O_3$ type, which are outgassed from the surface of the silicon ingot and at the tail-end thereof. Complementary removal may be carried out by acid attack, after zone purification or after each pass. A mixture such as of hydrofluoric acid and nitric acid, may be used, according to a known technique.

The addition of oxygen to the plasma does not exclude simultaneous addition of a percentage of hydrogen which will be typically of about 1% so as to take advantage of the reactivity of hydrogen and the attendant temperature increase, which results in removal of other impurities.

On the other hand, it will be generally desirable to avoid nitrogen which would cause nitridation of the silicon.

The process of the invention may be carried out in an apparatus which comprises a conventional boat containing the bar to be processed and means for moving the boat and a plasma gun relative to each other. The plasma gun will be associated with means for supplying it with a mixture of plasma-producing gas and an adjustable amount of oxygen, for example by means of a controlled leak valve. The boat will be provided with cooling means, so that melting takes place in a "self-crucible"; then no impurity from the boat is introduced into the bar during purification.

The plasma may preferably be generated by a purely inductive method without any electrode which might introduce impurities into the plasma.

The invention will be better understood from the following description of a particular embodiment of the invention, given by way of example.

SHORT DESCRIPTION OF THE DRAWINGS

DETAILED DESCRIPTION OF A PARTICULAR EMBODIMENT

Before an apparatus according to the invention is described, it may be advisable to provide a discussion of the invention and the influence of the oxygen content of the plasma.

Figure 1:
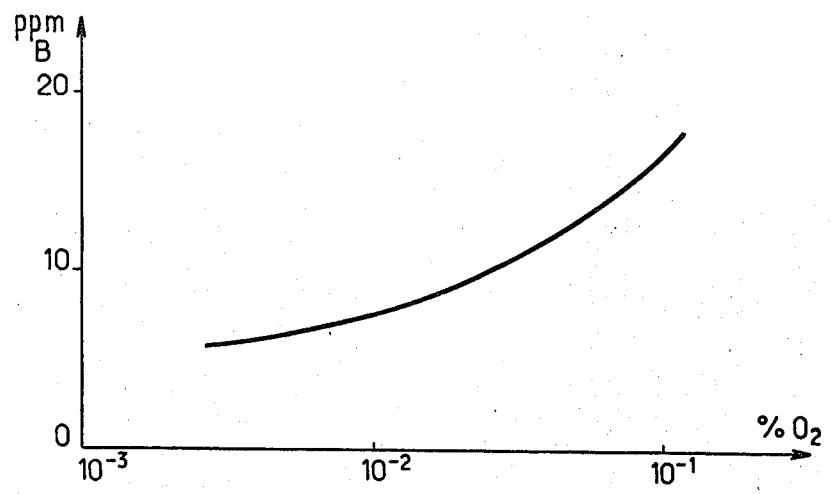
FIG. 1 is a diagram showing the relation between the percentage of boron volatilized out of a silicon bar, and the percentage of oxygen introduced into the processing plasma, for a silicon bar of electronic quality doped with 74 ppm of boron.

Experiments have shown that the amount of boron which is removed, particularly by vaporization of a volatile compound, is particularly dependent on the oxygen content of the plasma. Referring to the curve of FIG. 1, there is illustrated an example of relation between the weight of boron removed by volatilization and the percentage of oxygen in the plasma, in the case of a sample formed by a bar of silicon of electronic quality doped with 74 ppm of boron (i.e. $10^{17}$ at/cm$^3$). Tests with plasma formed from argon and 0.1% of hydrogen, with a variable amount of oxygen, have shown that the amount of boron removed in four passes increases with the oxygen content of the plasma. It is possible to derive, from tests similar to those whose results are illustrated in FIG. 1, the optimum oxygen composition to be used for processing a particular silicon.

As mentioned above, it will be generally of advantage to use an amount of oxygen 100 to 300 times greater than the amount of boron to be removed. However, this rule might lead to an excessive amount of oxygen and, in practice, a limit will be set at about 0.1% oxygen.

Figure 2:
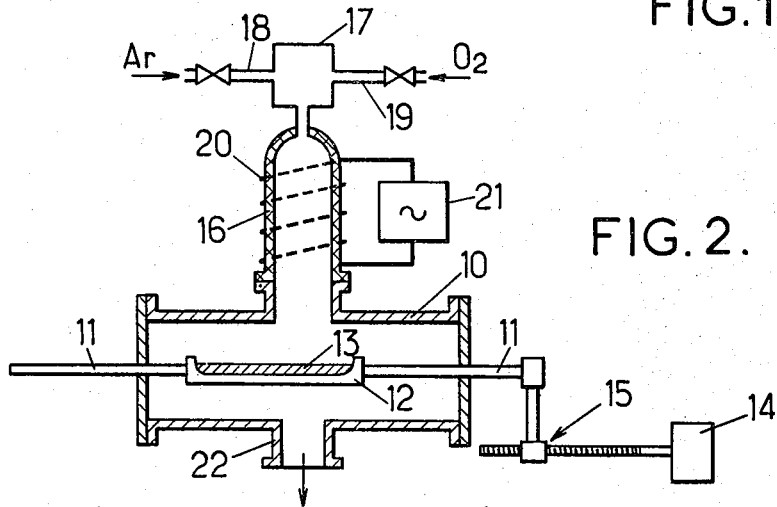
FIG. 2 is a simplified diagram of an apparatus for carrying out the process of the invention.

The process may be carried out in an apparatus as shown in FIG. 2. The apparatus comprises an enclosure of generally cylindrical shape 10 with a horizontal axis, closed by air-tight covers through which openings are provided for passing rods 11 supporting a boat 12 which receives the bar 13 of silicon to be purified. A mechanism, shown schematically by a motor 14 and a screw nut connection 15, is provided to move the boat parallel to the axis of enclosure 10. A vertical tube 16 of insulating material, e.g. quartz, is sealingly connected to the upper wall of enclosure for producing plasma and directing it towards the boat. The upper part of tube 16 is connected to receive a mixture of plasma-producing gas and of additives including oxygen. Referring to FIG. 2, the mixture inlet device comprises a mixing chamber 17 which receives a plasma-producing gas (purified argon or helium, in general) from a supply duct 18 having an adjustment valve, and oxygen from an oxygen supply duct 19 having a controlled leak valve for adjusting the oxygen flow rate to a very low and accurate level.

A winding 20 encircling tube 16 is connected to a high frequency generator 21, of sufficiently high power to develop in the tube a high frequency field creating a plasma.

Enclosure 10 may further comprise an outlet 22 for connecting the enclosure to a vacuum pump, for draining the enclosure or for improving the gas flow at a pressure close to the atmospheric pressure.

The process carried out in the apparatus shown in FIG. 2 is quite similar to zone purification except that the plasma directed towards the silicon contained in boat 12 has a different composition. Moreover, the boat is maintained at a temperature such that the lower part of the bar remains unmelted, for example by circulation of a cooling fluid. Then, the temperature gradient which causes the purification process has maximum efficiency with a plasma which heats the surface of the bar to a temperature slightly less than its boiling temperature.

Boron reacts and gives rise to volatile compounds of the $B_2O_3$ type, which evaporate through the surface of the bar. There is moreover a concentration of impurities in the tail end portion of the bar, due to the conventional zone refining process. The boron drawn to the tail end may be removed by attack with an acid.

There may be further added to the plasma an amount of hydrogen selected so as to remove impurities other than boron by overheating the surface of the bar.

There will now be described, by way of examples, results obtained with two samples of B-doped Si; the silicium was otherwise of electronic purity, for easier determination of the purity by resistivity measurement, without influence from impurities other than boron.

Two types of sample were tested.

1. A first sample was formed of silicon doped with 34 ppb of boron, i.e. $45.10^{15}$ at/cm$^3$. With a single pass under an argon plasma with 0.01% oxygen, boron was practically wholly removed: the resistivity passed from 3 $\Omega$cm to 150 $\Omega$cm throughout the length covered. A second treatment may be carried out, this time with an argon-hydrogen plasma, so as to eliminate the crystallographic defects introduced by the first treatment and to obtain a monocrystal. The resistivity then is increased from 150 to 300 $\Omega$cm.

Figure 3:
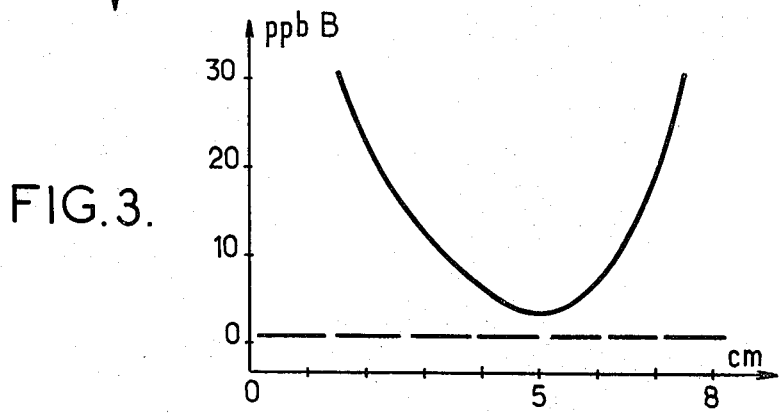
FIG. 3 is a curve representing the distribution of boron in a silicon bar, after processing by plasma without addition of oxygen (solid line curve) and containing a specific amount of oxygen (broken line curve).

The results are illustrated by the broken line curve in FIG. 3, which shows the final boron content of the sample along the bar, for a processing speed of 40 cm/h, with an argon flow rate of 35 l/mm and an oxygen flow rate of 2.5 cm$^3$/mn. During the second phase, the hydrogen flow rate was 70 cm$^3$/mn. A comparison with the solid line curve, corresponding to processing under the same conditions, but without oxygen, shows that instead of a content of about 0.6 ppb along the whole of the bar, there remains, at the tail end of the bar, a high content after two passes. The average content along the bar is about 20 ppb. There is a very slow removal of boron due to a slight amount of oxygen (about 10 ppm) contained in the argon.

2. A second type of sample was formed of silicon containing 74 ppm of boron. Tests, particularly those which led to the graph of FIG. 1, were carried out with an argon plasma with 0.1% added oxygen and 0.1% hydrogen. By way of example, removal of 20 ppm of boron required four passes under oxygen containing plasma, whereas with a much lower oxygen concentration (0.01%), the amount of boron removed from the purified portion under the same operating conditions was only 8 ppm.

It appears from the tests that metallurgical silicon containing 5 to 10 ppm of boron may be satisfactorily purified by means of the process of the invention, without introduction of attendant impurities having a harmful effect on the photovoltaic properties.

We claim:

1. A process for zone melting purification of silicon, comprising the steps of melting a zone of a bar of silicon to be purified by directing a jet of hot plasma obtained by high frequency excitation onto said zone and moving the jet and bar with respect to each other so as to cause the melted zone to travel along the bar, wherein the plasma is formed from a mixture of a plasma-producing gas and a sufficiently small amount of oxygen to avoid substantial oxidation of silicon.

2. A process according to claim 1 for boron removal, wherein the oxygen percentage of the plasma is adjusted to a value between 100 times and 300 times the boron percentage in said silicium.

3. A process according to claim 1, wherein the oxygen percentage of the plasma is adjusted to a value between 0.005% and 0.1%.

4. A process according to claim 1 or 2, wherein the plasma is created by a purely inductive process without electrodes.

5. A process according to claim 1, further comprising the steps of cleaning the ingot with acid to remove any boron compounds drawn to the surface of the ingot by zone melting.

6. A process according to claim 1, wherein hydrogen is added to the plasma-producing gas and to the oxygen in the plasma.

7. A process according to claim 1, further comprising the step of processing the ingot with a plasma containing no oxygen to eliminate defects after treatment with plasma containing oxygen.

* * * * *